(12) United States Patent
Lee et al.

(10) Patent No.: US 6,287,904 B1
(45) Date of Patent: Sep. 11, 2001

(54) TWO STEP MASK PROCESS TO ELIMINATE GATE END CAP SHORTENING

(75) Inventors: Raymond T. Lee, Sunnyvale; Zicheng Gary Ling, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/499,047

(22) Filed: Feb. 7, 2000

Related U.S. Application Data (60) Provisional application No. 60/177,673, filed on Jan. 27, 2000.

(51) Int. Cl.$^7$ .................................................. H01L 21/336
(52) U.S. Cl. ......................... 438/197; 438/299; 438/585; 438/666
(58) Field of Search ............................. 438/197, 53, 201, 438/714, 717, 734, 736, 751, 902, 299, 585, 666

(56) References Cited

PUBLICATIONS

Huang et al.,"An Accurate Gate Length Extraction Method for Sub Quarter Micron MOSFET's", 1996 IEEE, pp.958–964, Jun. 1996.*

* cited by examiner

Primary Examiner—Chandra Chaudhari
Assistant Examiner—Yennhu B. Huynh

(57) ABSTRACT

Metal oxide semiconductor devices are formed having gates with minimum endcap width and no source/drain leakage. A pair of source/drain regions is formed in a substrate, and a gate oxide is formed on the substrate. A layer of a conductive material, such as polysilicon, is formed on the gate oxide layer, masked and etched to form an extended-width gate having endcaps of a greater width than the endcap design rules. A second mask is formed to cover the extended-width gate up to the desired width of the endcaps (i.e., the design width) and to expose the portions of the extended-width gate beyond the endcap design width. The exposed portions of the extended-width gate are then etched, resulting in a completed gate having endcaps of the design width. Since the endcaps are initially formed to a greater width than the design width, any pullback that occurs during printing of the mask or etching of the gate does not cause the gate to be insufficiently wide to avoid source/drain leakage. Since the excess endcap material is removed, adjacent features and/or devices can be densely spaced on the substrate.

9 Claims, 9 Drawing Sheets

TWO STEP MASK PROCESS TO ELIMINATE GATE END CAP SHORTENING

CLAIM OF PRIORITY

This application claims priority from U.S. Provisional Patent Application Ser. No. 60/177,673 filed on Jan. 27, 2000.

FIELD OF THE INVENTION

The present invention relates to a method of manufacturing a semiconductor device, such as a transistor, on a semiconductor substrate. The invention has particular applicability in manufacturing semiconductor devices having photolithographically formed gates.

BACKGROUND ART

Current demands for high density and performance associated with ultra large scale integration require aggressive scaling (i.e., shrinking) of design rules, increased transistor and circuit speeds and improved reliability. Such demands for increased density, performance and reliability require formation of device features with high precision and uniformity.

Figure 1A:
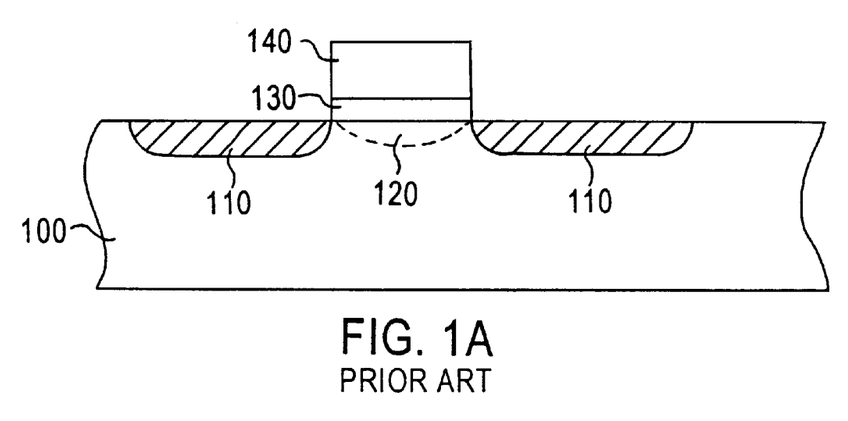
FIGS. 1A–1B illustrate a typical metal oxide semiconductor transistor.
Figure 1B:
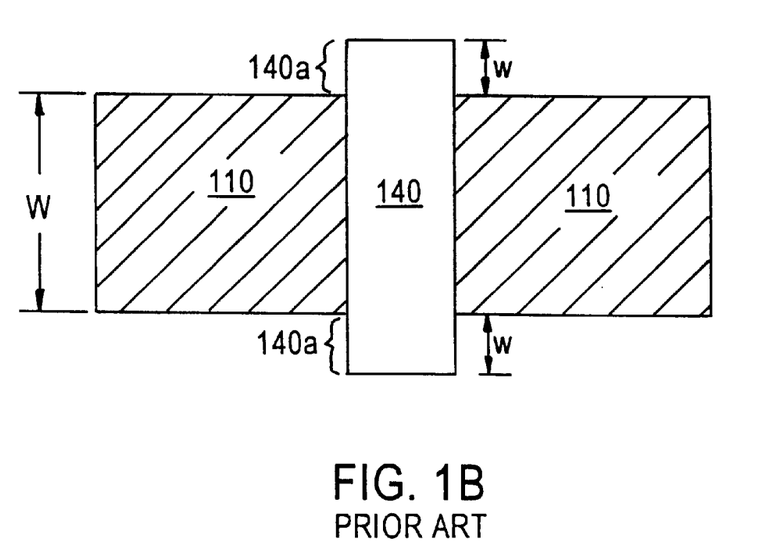

Metal oxide semiconductor (MOS) devices, as depicted in FIGS. 1a and 1b, are the building blocks of today's circuits, and typically comprise a pair of source/drain regions 110 formed, as by ion implantation, in a silicon substrate 100, and separated by an ion-implanted channel region 120. A gate oxide layer 130 is formed above channel region 120, and a conductive gate 140, such as a polysilicon gate, is formed on gate oxide layer 130. Gate 140 is typically formed by depositing a blanket layer of polysilicon, masking the polysilicon layer with a patterned photoresist mask, and etching the polysilicon layer. Gate 140 is typically a narrow polysilicon line that runs completely across the width W of source/drain regions 110 and channel region 120 (called the "bulk silicon region"), and has a width L, commonly referred to as "gate length".

The performance of MOS transistors is significantly affected by gate length L. For example, the current output of the transistor is proportional to W/L. Thus, a smaller gate length L will result in a higher-performance transistor per unit width of the bulk silicon region. As a result, newer circuit designs include increasingly smaller gate lengths; for example, a gate length of about 150 mn or less for a device having a design rule (i.e., minimum feature width) of about 180 nm. However, this aggressive reduction in gate length makes gate formation more difficult, due to the limitations of the photolithographic process.

Transistors such as those shown in FIGS. 1a and 1b have distinct "on" and "off" states. It is important for device performance to have a minimum amount of current flow, known as "leakage current", between source/drain regions 110 when the device is off (ideally, no current should flow). To effectively control the leakage current during its off state, transistor gate 140 must span or "strap" the entire width W of the bulk silicon region. To ensure that the gate length meets this requirement after processing, gate 140 must be photolithooraphically formed ("drawn") to extend beyond the width W of source/drain regions 110. The portions 140a of gate 140 that extend beyond width W are called "gate endcaps". Historically, to provide for a margin against possible layer-to-layer misalignment between the definition of transistor source/drain regions and the polysilicon gate, the end cap has been drawn at about half a feature size (i.e., about 250 nm for 0.5 micron technology).

Figure 2A:
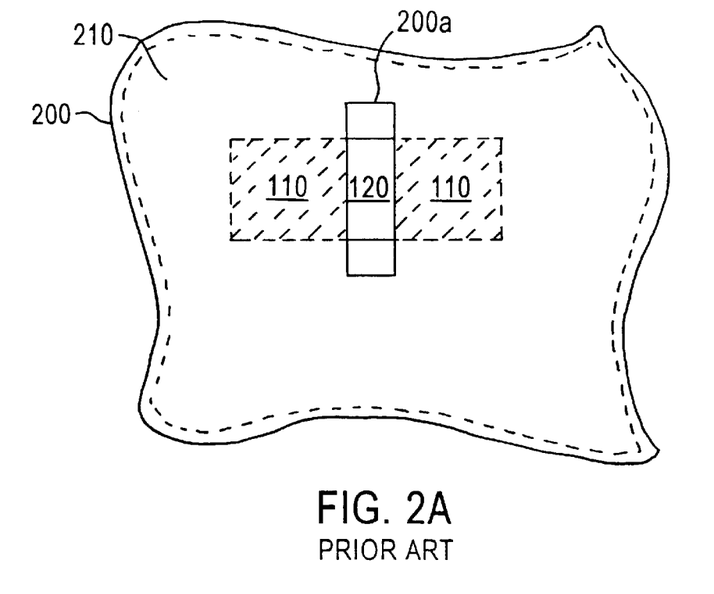
FIGS. 2A–2B schematically illustrate sequential phases of a conventional gate-formation method.

Disadvantageously, as feature size is scaled below about 250 nm, a phenomenon known as "pullback" occurs during lithographic printing of the narrow gate image onto the photoresist layer, and during subsequent etching of the polysilicon film. FIG. 2A depicts a reticle 200 employed to "print"(i.e. expose using a stepper) a photoresist mask on a blanket polysilicon layer 210 that has been deposited over source/drain regions 110 and channel region 120. Reticle 200 has a chrome feature 200a of the desired size of gate 140, including endcaps 140a of design rule length.

Figure 2B:
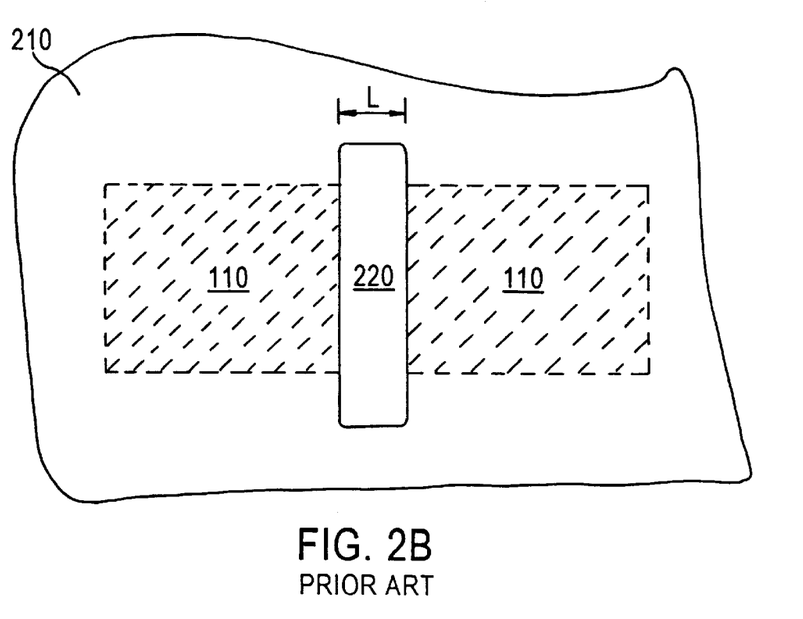
Figure 2C:
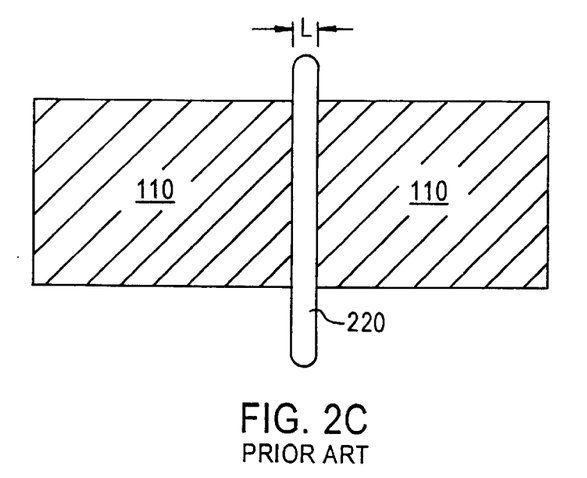
FIGS. 2C–2D illustrate typical results of conventional gate-formation methods.

FIGS. 2B and 2C illustrate typical results of the photolithographic printing process. In FIG. 2B, wherein the gate length L (i.e., the width of chrome island 120) is substantially larger than the exposing wavelength (typically about 248 nm for current technology), the printed gate image 220 matches the drawn geometry of chrome island 120 very well, with only minor corner rounding due to well-known optical properties. The extent of the corner rounding is small compared to the gate length L. However, as gate length is scaled towards or below the exposing wavelength, as illustrated in FIG. 2C, the printed endcap tip is significantly modified. The tip is completely rounded and exhibits endcap shortening known as "pullback". The amount of pullback increases with smaller gate lengths relative to the exposing wavelength, with increased exposing energy and with subsequent etching. Tip rounding and tip pullback necessitate that additional margin be built into the endcap design rules.

Figure 2D:
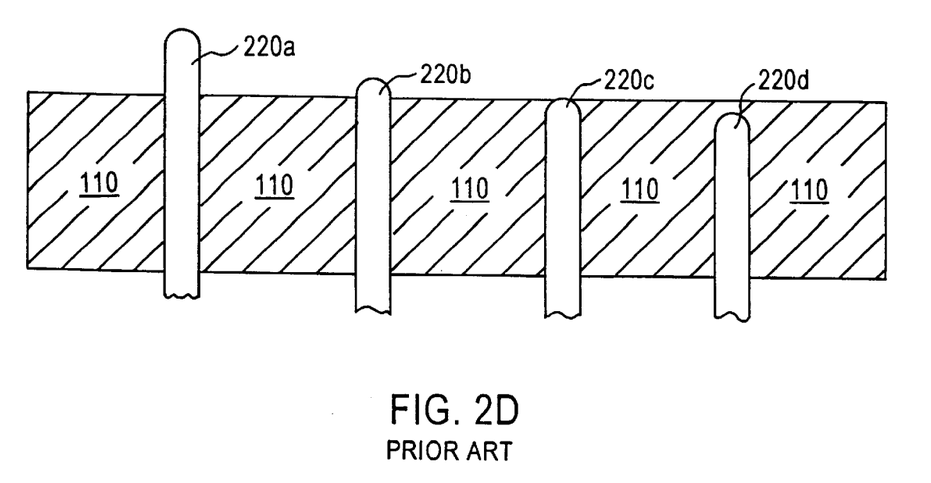

FIG. 2D illustrates four possible gate and endcap configurations after final processing, two of which (gates 220a and 220b) are adequate, and two of which (gates 220c and 220d) reflect unacceptable endcap design. To minimize transistor off state leakage, it is not sufficient to guarantee that the endcap straps the entire width W of the transistor (i.e., it is not sufficient to simply provide a margin against misalignment and pullback). The endcap must be of sufficient length to extend beyond the transistor width, since if the gate has a rounded portion within the transistor width, as in gate 220c, the rounded portion will contribute to increased off state leakage. Thus, as the design rule for the transistor is scaled, the endcap design rule must be increased to maintain an acceptable margin against off state leakage. For example, the endcap design rule for a 180 nm device design rule is typically 1.5× minimum feature size, which is far larger than the 0.5× minimum feature size design rule used on earlier technologies. Thus, for each global design rule shrink, the endcaps need to be redrawn, thereby increasing manufacturing costs.

A conventional technique to reduce pullback is to form larger endcaps 140a, such as by adding so-called "hammerheads" to their tips. However, due to space constraints on substrate 100 between endcaps of neighboring devices and between endcaps and other features on the substrate (such as conductive polysilicon lines and metal lines), the size of the hammerheads must be limited, decreasing their effectiveness, or the features on the substrate must be undesirably spaced farther apart than the minimum spacing allowed under the design rules, thereby decreasing transistor density. There exists a need for a methodology for reducing or eliminating gate endcap pullback, thereby enabling increased transistor density, reducing manufacturing costs and improving device performance.

SUMMARY OF THE INVENTION

An advantage of the present invention is a method of manufacturing a semiconductor device without harmful gate endcap pullback, thereby avoiding current leakage between source/drain regions of the device while enabling adjacent devices and features to be more densely packed on the substrate than conventional methodologies.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a method of manufacturing a semiconductor device on a semiconductor substrate comprising a gate having a predetermined width, which method comprises forming an extended-width gate to a width greater than the predetermined width; masking to cover the extended-width gate to the predetermined width and to expose a portion of the extended-width gate extending beyond the predetermined width; and etching the exposed portion of the extended-width gate.

In another aspect of the present invention, wherein a plurality of semiconductor devices are formed on the substrate, the method comprises forming the extended-width gate to comprise a first gate associated with a first semiconductor device and a second gate associated with a second semiconductor device adjacent to the first semiconductor device; wherein the portion of the extended-width gate extending beyond the predetermined width is disposed between the first and second gates.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional techniques for manufacturing semiconductor devices having conductive gates result in gates which do not extend completely across the width of the source/drain regions of the device, thereby causing current leakage when the device is off. To avoid such leakage, conventional methodologies provide relatively large gate endcaps and, as a result, must undesirably decrease the density of the devices on the substrate. The present invention addresses and solves these problems stemming from conventional manufacturing processes.

According to the methodology of the present invention, a pair of source/drain regions is formed in a substrate, and a gate oxide is formed on the substrate. As used throughout the present disclosure and claims, the term "substrate" denotes a semiconductor substrate or an epitaxial layer formed on the semiconductor substrate. A layer of a conductive material, such as polysilicon, is formed on the gate oxide layer, masked and etched to form an extended-width gate having endcaps of a greater width than the endcap design rules. A second mask is formed to cover the extended-width gate up to the desired width of the endcaps (i.e., the design width) and to expose the portions of the extended-width gate beyond the endcap design width. The exposed portions of the extended-width gate are then etched, resulting in a completed gate having endcaps of the design width. Since the endcaps are initially formed to a greater width than the design width, any pullback that occurs during printing of the mask or etching of the gate does not cause the gate to be insufficiently wide to avoid source/drain leakage. Furthermore, since the excess endcap material is removed, adjacent features and/or devices can be more densely spaced on the substrate than with prior art methodologies.

Figure 3A:
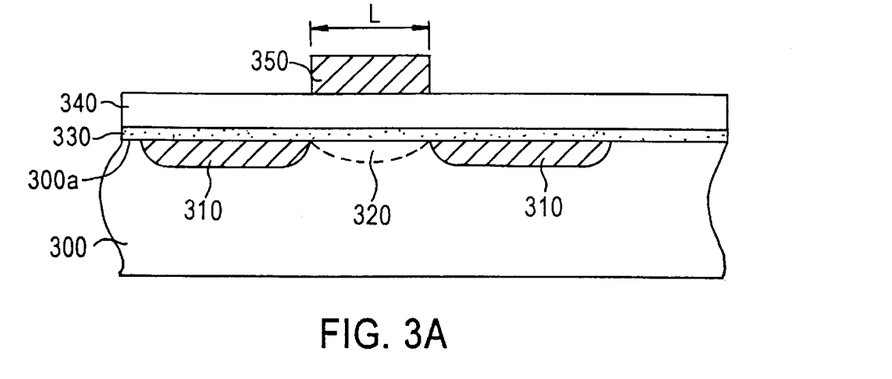
FIGS. 3A–3E schematically illustrate sequential phases of a method in accordance with an embodiment of the present invention.
Figure 3B:
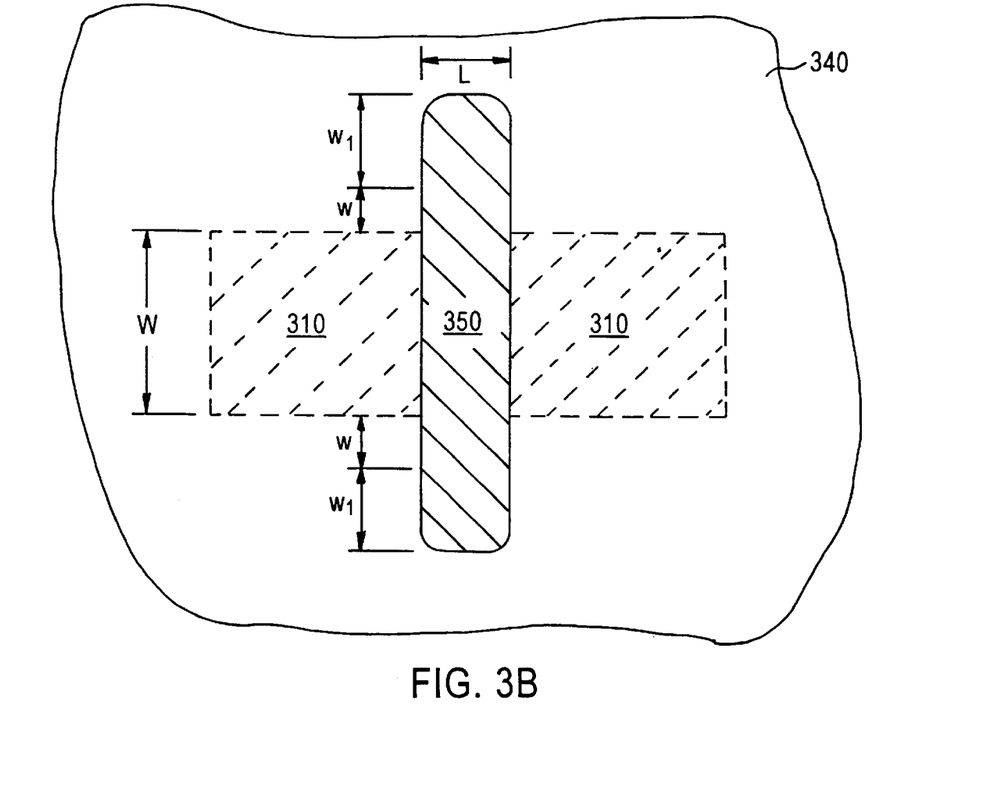

An embodiment of the present invention is illustrated FIGS. 3A–3E. As illustrated in FIGS. 3A–3B, conventional source/drain regions 310 and a channel region 320 having a width W are formed in a substrate 300, as by ion implantation. Alternatively, channel region 320 can be formed at a later time. A conventional gate oxide layer 330 is formed on main surface 300a of substrate 300, as by thermal oxidation, followed by a layer of conductive material 340, such as a blanket layer of polysilicon as by chemical vapor deposition.

Figure 3C:
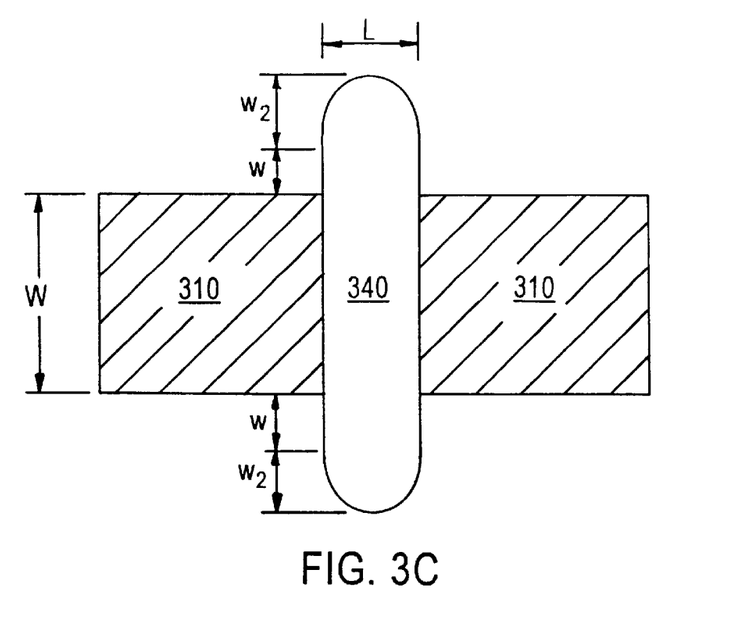

A first mask 350, such as a photoresist mask, is formed on polysilicon layer 340 to cover the portion of polysilicon layer 340 corresponding to a gate to be formed having gate length L, endcaps extending to a width w (typically half a feature size) beyond width W of source/drain regions 310, and extended-width portions having a width $w_1$ beyond endcap width w. Polysilicon layer 340 is then etched, as by dry etching, to form extended-width gate 340 (as shown in FIG. 3C) that includes endcap width w and excess width $w_2$. Width $w_1$ should be sufficient to ensure that, although excess $w_2$ may be smaller than $w_1$, endcap width w and length L are not compromised, even with aggressive overexposure and etch bias to achieve a reduced gate length compared to minimum feature size.

Figure 3D:
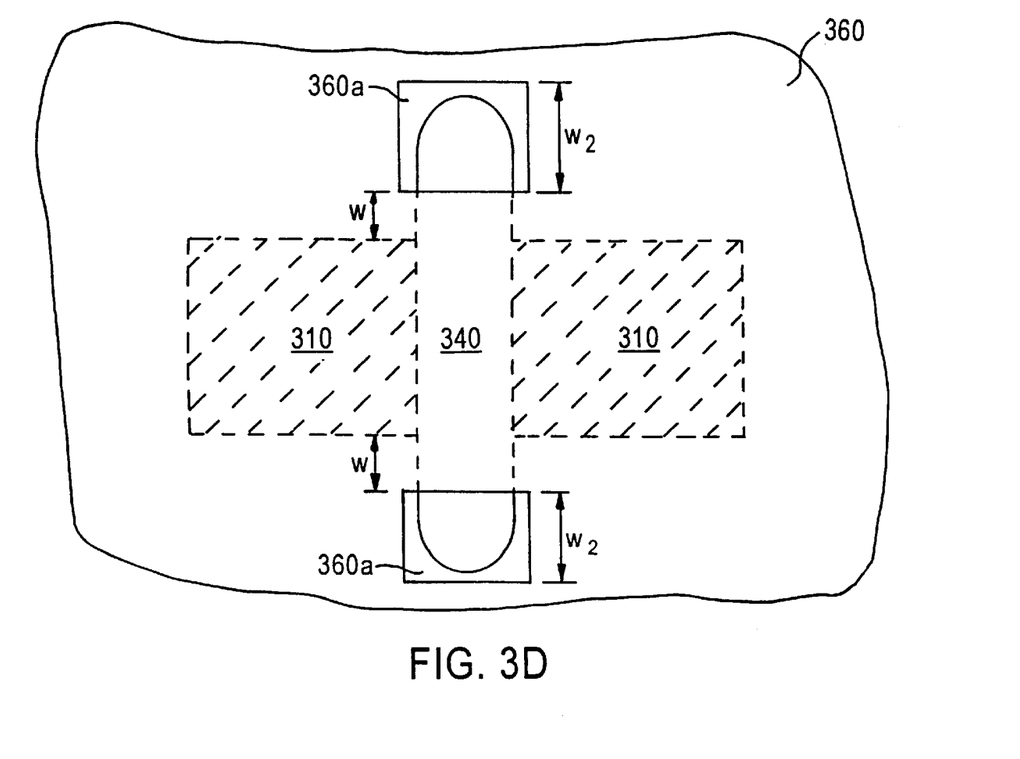
Figure 3E:
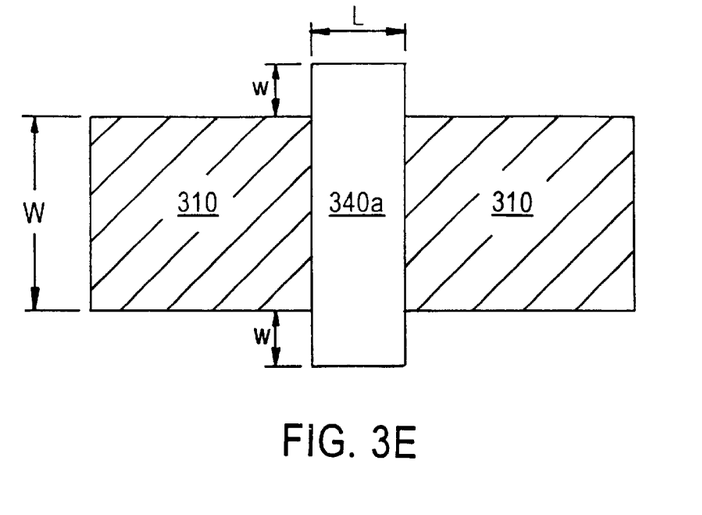

Referring now to FIG. 3D, a second photoresist mask 360 is formed to cover extended-width gate 340 and source/drain regions 310 except for the excess-width portions having width $w_2$, which are exposed through openings 360a. The excess-width portions are then etched, as by dry etching, resulting in completed gate 340a (see FIG. 3E) having endcaps of width w and a gate length L Since the endcaps are full-sized; i.e., not shortened by the printing or etching process, gate 340a fully extends across the bulk silicon region (width W), and the finished device will not exhibit current leakage due to gate endcap shortening.

Further embodiments of the present invention illustrate how the present invention enables increased feature density.

Figure 4A:
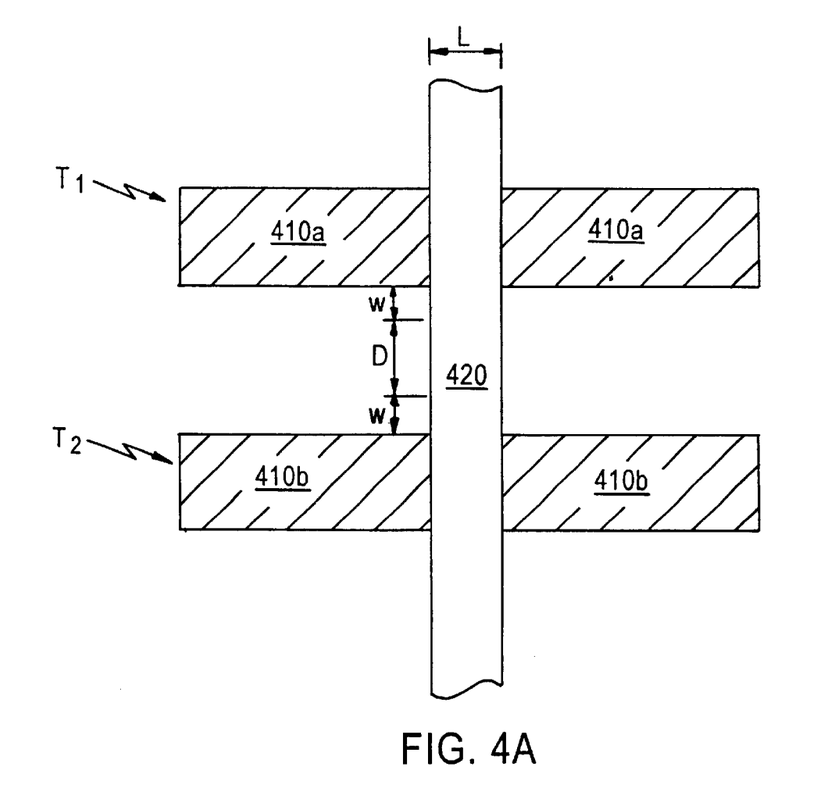
FIGS. 4A–4C schematically illustrate sequential phases of a method in accordance with another embodiment of the present invention.

Referring now to FIG. 4A, in another embodiment of the present invention, an extended-width gate 420 is formed, as of polysilicon, by masking with a first mask as described above, and etching. Extended-width gate 420 is associated with a plurality of transistors, such as a first transistor $T_1$ comprising source/drain regions 410a, and a second transistor $T_2$ comprising source/drain regions 410b. Extended-width gate 420 has a gate length L, comprises gate endcaps between transistors $T_1$ and $T_2$ having a width w, and an excess-width portion having a width D between the endcaps.

Figure 4B:
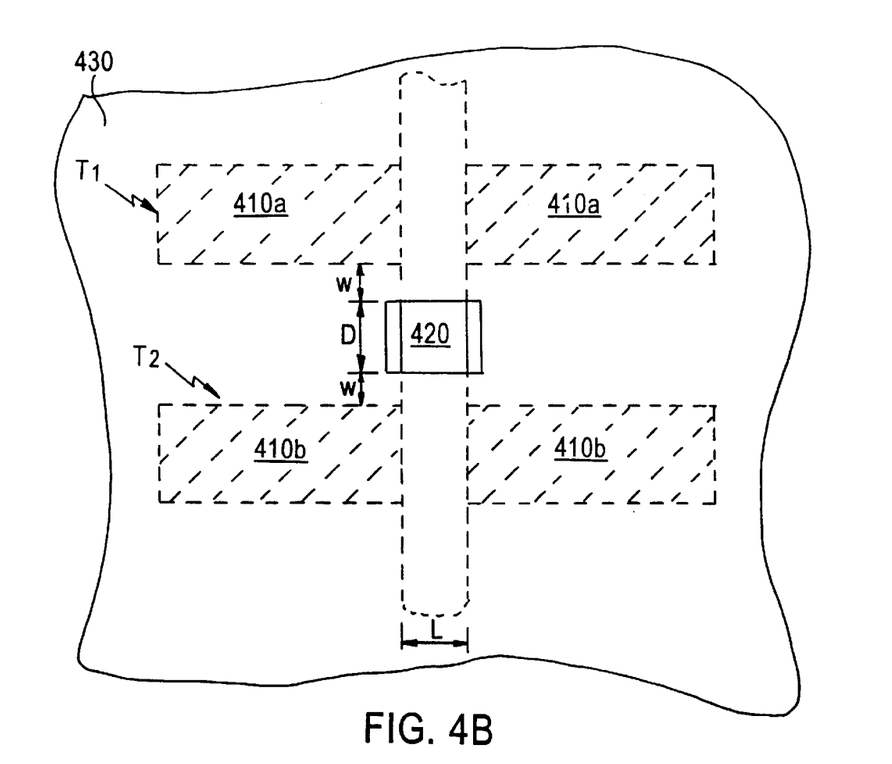

As shown in FIG. 4B, a second mask 430 is formed to cover transistors $T_1$, $T_2$ and extended-width gate 420 except for the excess-width portion having width D. After etching the excess-width portion of gate 420, as by dry etching, the result is two separate gates 420a, 420b, each comprising at least one endcap having a width w (see FIG. 4C).

Figure 4C:
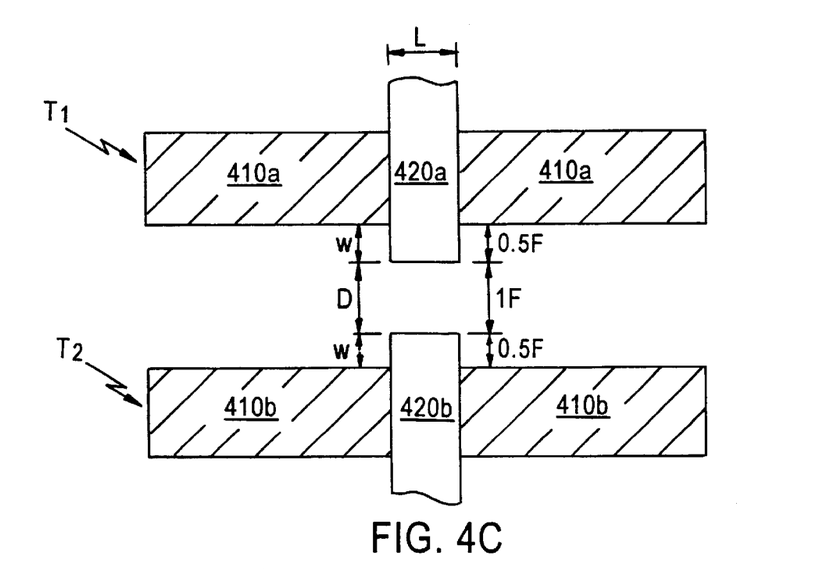

Extended-width gate 420 is formed without defining gate endcap width w, thereby eliminating pull-back (i.e., endcap rounding) that would have occurred in prior art methodologies due to the small size of gate length L, while second mask 430 defines the final endcap extension w. Therefore, width w of the endcaps can advantageously be the design rule minimum dimension for misalignment tolerance, typically half a feature size (0.5 F), and excess width D can be the design rule minimum mask-opening size, typically one feature size (1 F), resulting in transistors $T_1$ and $T_2$ being spaced only two features sizes (2 F) apart. In contrast, conventional gate-formation methodologies utilizing oversized endcaps to compensate for pull-back typically have an endcap width w of 1.5 F and a gate-to-gate distance (comparable to D) of 1.5 F, resulting in transistors $T_1$ and $T_2$ being spaced 4.5 F apart. Thus, the present methodology results in a 56% decrease in the spacing between transistors $T_1$ and $T_2$.

Figure 5A:
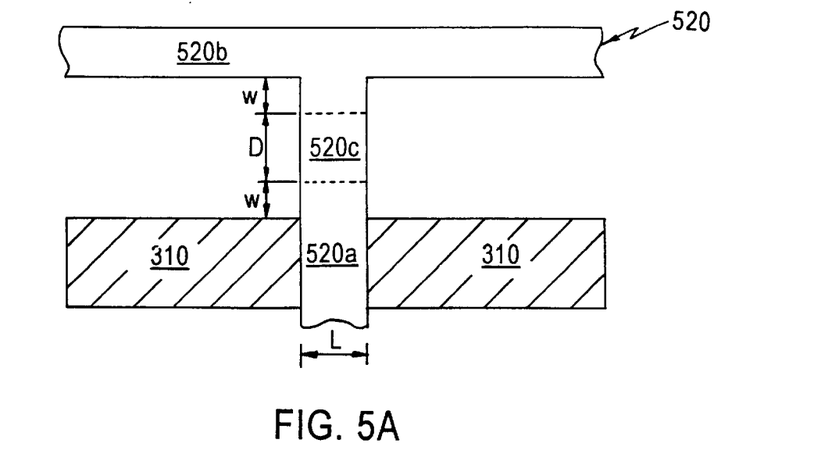
FIGS. 5A–5C schematically illustrate sequential phases of a method in accordance with still another embodiment of the present invention.

In a further embodiment of the present invention, as illustrated in FIG. 5A, an extended-width gate 520 is formed, as of polysilicon, between source/drain regions 310 by masking with a first mask as described above, and etching. Extended-width gate 520 comprises a gate portion 520a with a gate length L and a gate endcap having a width w, a conductive line portion 520b, approximately orthogonal to gate portion 520a, with a misalignment tolerance portion having a width w, and an excess-width portion 520c having a width D between the endcap and conductive line portion 520b.

Figure 5B:
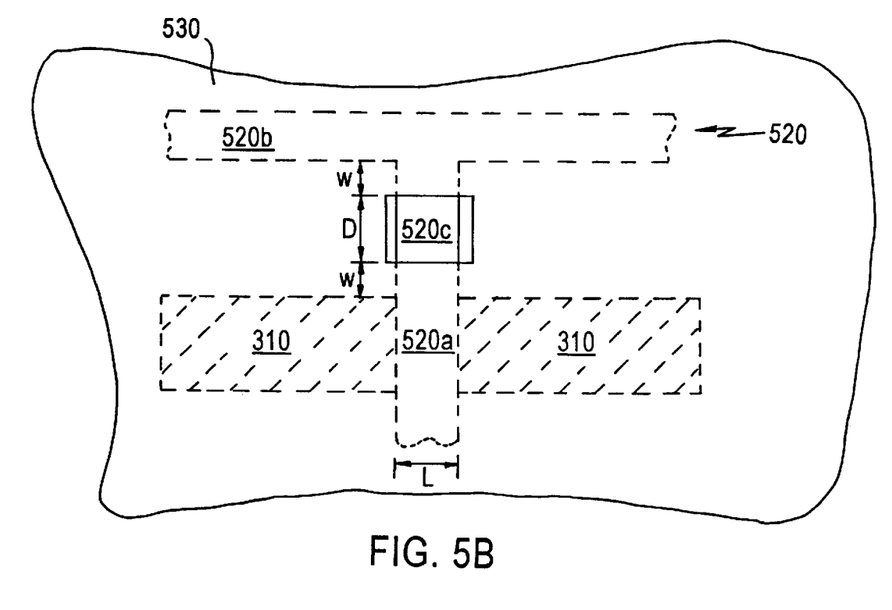
Figure 5C:
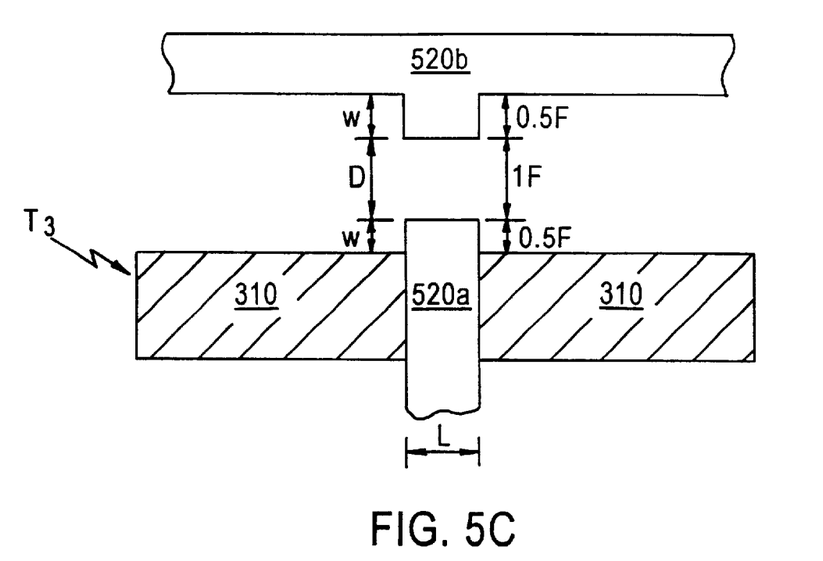

As shown in FIG. 5B, a second mask 530 is formed to cover source/drain regions 310 and extended-width gate 520 except for excess-width portion 520c having width D. After etching excess-width portion 520c, as by dry etching, the result is a gate 520a comprising at least one endcap having a width w, and a conductive line 520b comprising a misalignment tolerance portion having a width w (see FIG. 5C).

As in the embodiment of FIGS. 4A–4C, extended-width gate 520 is formed without defining gate endcap width w, thereby eliminating pull-back (i.e., endcap rounding), while second mask 530 defines the final endcap extension w. Therefore, width w of the gate endcap and the conductive line misalignment tolerance portion can advantageously be the design rule minimum dimension, typically half a feature size (0.5 F), and excess width D can be the minimum mask-openiig size, typically one feature size (1 F), resulting in gate 520a and conductive line 520b being spaced only two features sizes (2 F) apart. In contrast, conventional gate-formation methodologies utilizinig oversized endcaps to compensate for pull-back typically have an endcap width w of 1.5 F and a gate-to-conductive line distance (i.e., a "poly to poly distance") of 1.5 F, resulting in transistors and conductive lines being spaced 3 F apart. Thus, the present methodology results in a 33% decrease in the spacing between transistor $T_3$ and conductive line 520b.

Figure 6:
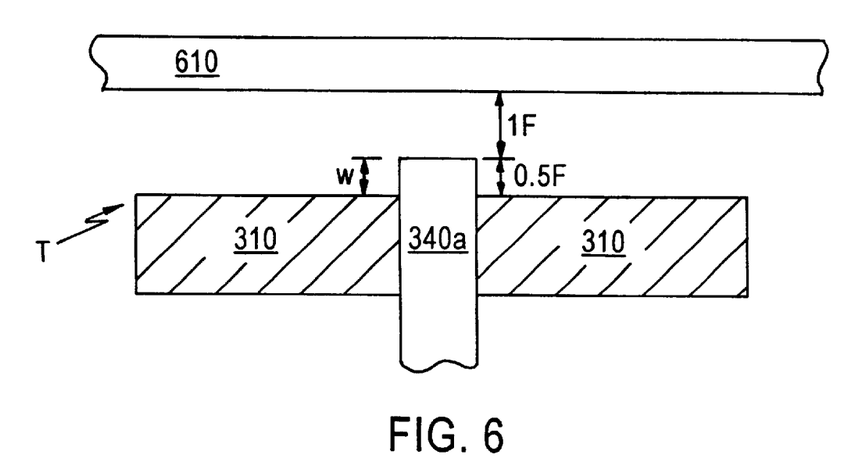
FIG. 6 is a top view of a semiconductor device and a local interconnect according to an embodiment of the present invention.

In a still further embodiment of the present invention, as illustrated in FIG. 6, a transistor T is formed comprising source/drain regions 310 and gate 340a having an endcap of width w, as in the embodiment of FIGS. 3A–3E. A metal line 610, such as a local interconnect (LI) is subsequently formed in a conventional manner, as by depositing a blanket metal layer, masking and etching. If the endcap width w is 0.5 F by design rule, and the LI-to-gate design rule minimum distance is 1 F, then the total distance between source/drain regions 310 and Li 610 is 1.5 F utilizing the present methodology. In contrast, conventional gate-formation methodologies utilizing oversized endcaps to compensate for pull-back and having an endcap width w of 1.5 F would result in transistor to LI spacing of 2.5 F. Thus, the present methodology results in a 40% decrease in the spacing between transistor T and LI 610.

The present invention is applicable to the manufacture of various types of semiconductor devices, particularly high density semiconductor devices having a design rule of about $0.18\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device on a semiconductor substrate comprising a gate having a predetermined width, which method comprises:

forming an extended-width gate to a width greater than the predetermined width;

masking to cover the extended-width gate to the predetermined width and to expose a portion of the extended-width gate extending beyond the predetermined width; and etching the exposed portion of the extended-width gate.

2. The method of claim 1, comprising:

forming a layer of polysilicon on the substrate;

forming a first photoresist mask on the polysilicon layer to cover a portion of the polysilicon layer corresponding to the extended-width gate;

etching to form the extended-width gate; and forming a second photoresist mask on the extended-width gate, the second photoresist mask having an opening corresponding to the portion of the extended-width gate extending beyond the predetermined width.

3. The method of claim 1, wherein a plurality of semiconductor devices are formed on the substrate, the method comprising:

forming the extended-width gate to comprise a first gate associated with a first semiconductor device and a second gate associated with a second semiconductor device adjacent to the first semiconductor device;

wherein the portion of the extended-width gate extending beyond the predetermined width is disposed between the first and second gates.

4. The method according to claim 3, wherein after etching, the first and second gates are spaced apart from each other about a minimum distance according to the design rules of the semiconductor device.

5. The method of claim 1, comprising forming the extended-width gate to include a conductive line;

wherein the portion of the extended-width gate extending beyond the predetermined width is disposed between the gate and the conductive line.

6. The method of claim 5, comprising forming the extended-width gate such that the conductive line is approximately orthogonal to the gate.

7. The method according to claim 5, wherein after etching, the gate and the conductive line are spaced apart from each other about a minimum distance according to the design rules of the semiconductor device.

8. The method according to claim 1, wherein the semiconductor device comprises a pair of source/drain regions, the method forming a metal line spaced apart from the source/drain regions about a minimum distance according to the design rules of the semiconductor device.

9. The method according to claim 1, wherein the semiconductor device comprises a pair of source/drain regions, and the predetermined gate width comprises a width of the source/drain regions and an endcap width.

\* \* \* \* \*